United States Patent [19]

Gardner et al.

[11] Patent Number: 5,643,825
[45] Date of Patent: Jul. 1, 1997

[54] INTEGRATED CIRCUIT ISOLATION PROCESS

[75] Inventors: Mark I. Gardner, Cedar Creek; Fred N. Hause, Austin, both of Tex.; Kuang-Yeh Chang, Los Gatos, Calif.

[73] Assignee: Advanced Micro Devices, Inc., Sunnyvale, Calif.

[21] Appl. No.: 366,053

[22] Filed: Dec. 29, 1994

[51] Int. Cl.$^6$ .................................................. H01L 21/76
[52] U.S. Cl. ............................ 437/70; 437/29; 437/42; 437/244
[58] Field of Search ........................ 437/61, 69, 70, 437/243, 244; 432/29, 42

[56] References Cited

U.S. PATENT DOCUMENTS

| | | | |
|---|---|---|---|
| 4,462,040 | 7/1984 | Ho et al. | 357/23 |
| 4,743,563 | 5/1988 | Pfiester et al. | 437/69 |
| 4,986,879 | 1/1991 | Lee et al. | 437/69 |
| 5,004,701 | 4/1991 | Motokawa | 437/69 |
| 5,177,589 | 1/1993 | Kobayahi et al. | 257/773 |
| 5,192,707 | 3/1993 | Hodges et al. | 437/70 |
| 5,256,563 | 10/1993 | Moslehi et al. | 437/61 |
| 5,296,411 | 3/1994 | Gardner et al. | 437/238 |
| 5,428,237 | 6/1995 | Yuzurihara et al. | 257/349 |
| 5,429,971 | 7/1995 | Yang | 437/43 |
| 5,483,090 | 1/1996 | Kitamura et al. | 257/231 |

FOREIGN PATENT DOCUMENTS

| | | | |
|---|---|---|---|
| 406151420 | 5/1994 | Japan | 437/69 |

*Primary Examiner*—John Niebling
*Assistant Examiner*—Long Pham
*Attorney, Agent, or Firm*—Kevin L. Daffer; Conley, Rose & Tayon

[57] ABSTRACT

An improved process is provided for forming field dielectric in lieu of local oxidation process often referred to as the "LOCOS" process. The improved process utilizes blanket formation of first and second dielectrics across an entire semiconductor substrate. In a subsequent step, both first and second dielectrics are selectively removed in areas overlying active regions. The first and second dielectrics are formed using a combination of thermal growth and/or chemical deposition. The resulting field dielectric structure is relatively thin, yet demonstrates superior dielectric properties. Blanket formation followed by select removal ensures a fine-line demarcation between field and active regions and substantially eliminates encroachment problems normally associated with conventional LOCOS. Additionally, the thin field dielectric structure can be formed with rounded or reflowed corners to avoid step coverage problems for subsequently placed conductive elements.

22 Claims, 2 Drawing Sheets

INTEGRATED CIRCUIT ISOLATION PROCESS

BACKGROUND OF THE INVENTION

1. Field of the Invention

This invention relates to integrated circuit fabrication and more particularly to an MOS isolation process which avoids local oxidation in field regions and the problems associated therewith.

2. Description of the Relevant Art

It is generally well known that MOS integrated circuits are self-isolated, provided the source-substrate and drain-substrate pn junctions are held at reverse bias. If the pn junctions are forward biased, a drain current will flow from the source to the drain through a channel under the gate. The self-isolation property of MOS devices represents a substantial area savings for integrated circuit devices using such technology. Hence, densely patterned integrated circuits are generally fabricated with MOS technology.

Forming an integrated circuit involves interconnecting sets of integrated circuit devices which can be activated according to a specific circuit function. Thus, integrated circuit devices are typically referred to as "active devices" and a complex integrated circuit can embody several hundred thousand or more active devices on a single monolithic substrate. The interconnect structure includes patterned conductive strips which extend across a dielectric, and the dielectric functions to electrically separate those strips from the underlying region between active devices. The region between active devices (i.e., circuit elements such as transistors, capacitors, diodes, resistors, etc.) is often termed "field region", and the dielectric which separates the field region from the overlying conductive lines is generally termed "field dielectric".

For proper isolation and functionality, the conductive strips, when active, should be prevented from forming channels in the field regions. The threshold value in the field region must therefore be quite large and, in most instances, several volts above the operation voltage of the active devices. If threshold in the field region is too low, then a field region inversion will occur causing a parasitic MOS transistor to occur.

Typically, field region threshold can be increased by either increasing the field dielectric thickness and/or raising the doping level of the underlying field region. Increasing field dielectric thickness would raise the threshold voltage, but would also give rise to step coverage problems of the conductive strips extending over the step between the field dielectric and the active diffusion areas. Increasing field dielectric is thereby moderately done in conjunction with implanting a "channel-stop implant" into the field region underneath the field dielectric.

A conventional technique used to minimize step coverage problems while ensuring accurate placement of channel-stop implant is to locally oxidize silicon in the field regions. Local oxidation is a mainstay in MOS fabrication and is generally referred to as the "LOCOS" technique. LOCOS process begins by covering the pad oxide overlying the active regions with a thin layer of silicon nitride that prevents oxidation from occurring beneath the nitride. After the nitride layer has been etched away in the field regions and prior to field dielectric growth, the silicon in the exposed regions can then be selectively implanted with the channel-stop dopant. Thus, the channel-stop implant is accurately placed since it is self-aligned to the field region opening. After the field region is implanted, a field dielectric is formed upon and/or within the field region. The field dielectric is grown in all directions causing a sloped "bird's beak" in the step locations. Bird's beak minimizes step coverage problems but, as will be explained below, causes many other problems which must be avoided in high density VLSI designs.

LOCOS process can be carried out using many different process flows, including the well known semi- or fully-recessed techniques. Regardless of the technique used, the basic LOCOS process flow remains the same. A pad oxide is blanket grown upon a silicon surface and then a nitride layer is deposited over the pad oxide. The pad oxide and nitride layers are then selectively removed to expose field regions of silicon substrate. A channel-stop dopant is then implanted and a field dielectric is thereafter grown in the exposed field regions. The pad oxide must be thick enough to minimize intrinsic stress created at the edge of the nitride film, yet must be thin enough to minimize lateral growth into the pad region and the underlying active devices. In many instances, a pad oxide of 200 to 600 angstroms is optimally needed to achieved both desired results. Even with a 200 angstrom pad oxide, lateral oxidation, often termed "encroachment" occurs whereby the growing field oxide encroaches into active regions which contain one or more active devices. Active regions are defined as those regions which exist within the semiconductor substrate between field regions.

As the field dielectric is thermally grown, the encroachment resulting therefrom appears as a bird's beak which extends into the active regions as a proportion of the field dielectric thickness. In most MOS applications, a conventional field dielectric is an oxide (or silicon dioxide), and the field dielectric is generally referred to as field oxide usually grown from a wet oxidation process, at a temperature of approximately 1000° C. for three to four hours to produce a thickness of 6000 Angstroms to 10000 Angstroms. Using the above example, bird's beak encroachment is typically 0.35 µm to 0.5 µm per side. Such an encroachment would make a lithographically defined 1.0 µm feature almost entirely disappear on the circuit following the field oxidation step. For high density MOS devices, (i.e., devices with less than 1.0 µm critical dimension) LOCOS cannot be used.

Beyond encroachment, LOCOS exhibits many other problems. For example, channel-stop species such as boron rapidly segregate not only along the substrate surface but perpendicular to the surface as well. In the latter instance, perpendicular segregation into the growing field oxide causes a phenomenon known as "oxidation-enhanced diffusion" or OED. In order to minimize OED, light ion channel-stop species such as boron must be implanted sufficiently deep so that they are not absorbed by growing field oxide. However, deep or heavy doping will cause high source/drain-to-substrate capacitances and will reduce source/drain-to-substrate pn junction breakdown voltages.

Another problem inherent in LOCOS is the formation of "Kooi ribbons" which form about the active region during the field oxidation process. Specifically Kooi ribbons of silicon nitride often form on the silicon surface of the active region near the field region boundary as a result of the reaction of $NH_3$ and silicon at that interface. The $NH_3$ is generated from the reaction of $H_2O$ and the masking nitride during the field oxidation step. The $NH_3$ then diffuses through the pad oxide and reacts with the silicon substrate to form silicon nitride, Kooi ribbons. Any gate oxide formed in the active area upon the ribbon locations are thinner and of lower quality than in other areas, causing low voltage breakdown of the gate oxide. Typically, a sacrificial gate oxide must be formed and thereafter striped to remove the Kooi ribbon, causing added processing steps and burdens.

The above problems associated with LOCOS generally stem from the step used in locally growing the field oxide. For example, encroachment is a result of lateral growth from field to active regions, OED is a result of perpendicular out-diffusion from channel-stop implant to overlying, growing field oxide, and Kooi ribbons are a result of $NH_3$ diffusion from nitride-covered active regions through the pad oxide and into the active region during field oxide growth. It would therefore be desirable to produce a fabrication process, wherein encroachment can at least be minimized and, in the optimum, eliminated altogether. Elimination of encroachment will allow the formation of devices having critical dimensions less than, for example, 1.0 μm. The engineer can thereby design high density features upon the masks at critical dimensions without fear of oxide encroachment or the possibility that the on-wafer critical dimension is eliminated. It would further be desirable to produce a channel-stop implant methodology which is less susceptible to segregation and OED. The improved implant step would be carried out without having to implant the peak concentration densities at prohibitive depths. Moreover, the implant step might be carried out after high temperature cycles resulting from oxide growth are complete such that temperature-induced segregation is minimized. The oxidation step might still further be carried out without having to grow a sacrificial gate oxide necessary to remove, for example, a Kooi ribbon. The preferred, improved methodology would thereby prevent formation of a Kooi ribbon and the resulting lower quality oxide, or localized oxide thinning.

SUMMARY OF THE INVENTION

The problems outlined above are in large part solved by the integrated circuit isolation process of the present invention. The isolation process hereof is carried out without having to locally form dielectrics in the field regions, i.e., without locally growing oxides using the LOCOS process. Instead of locally oxidizing silicon in the field regions, the present process blanket forms a dielectric layer across the entire wafer surface. The blanket-formed dielectric layer, or first dielectric film, is relatively thin and is much thinner than conventional field oxides. A second dielectric film is then formed across the entire first dielectric film. The blanket-formed first and second dielectric films are thereafter selectively removed in active regions within the semiconductor substrate.

The present method of forming first and second dielectric films and thereafter etching select regions of those films is deemed a blanket-grow-and-etch technique. Active regions and active devices formed therein are isolated by a field dielectric comprising a combination of first and second dielectric films. The first dielectric film, according to one embodiment, comprises a thermally grown oxide, grown in the absence of $H_2O$. The first dielectric film is generally grown to a thickness between 100 to 500 Angstroms and at a dielectric constant less than 4.0 or, in many instances, 3.7. According to an alternative embodiment, the first dielectric can be formed by chemical vapor deposition (CVD) of, for example, $SiO_x$ (x is approximately equal to two). The CVD film can thereafter be densified through an anneal step, preferably a rapid thermal anneal (RTA) mechanism.

Regardless of whether the first dielectric is grown or deposited, the resulting material presents enhanced dielectric properties from that of thicker, conventional field oxides. If grown, the first dielectric film is formed in the absence of a hydrogen or $H_2O$ ambient. Absent hydrogen, the first dielectric avoids the formation of $NH_3$ at the active region boundary, i.e., avoids Kooi ribbon and problems associated with Kooi ribbon. If deposited, the first dielectric film is deposited from a silicon and oxide source, and is thereafter annealed in a gas ambient selected from the group consisting of Ar, $N_2$, $N_2O$ and NO.

The second dielectric film can be formed similar to the first dielectric film—either thermally grown or vapor deposited. Preferably, the second dielectric film is grown either from a dry oxygen atmosphere or deposited from an inert deposition chamber and thereafter annealed in the absence of hydrogen. The first and/or second dielectric films comprise any dielectric having insulative capability including oxide, oxynitride, $N_2O$ oxide, $Ta_2O_5$, NO oxide, polysilicon, or silicon nitride. If silicon nitride is used as the dielectric, it is generally used as the second dielectric film, with the first dielectric film being a dielectric other than silicon nitride. The second dielectric is preferably thicker than the first dielectric. The first dielectric is suitably grown or deposited to a thickness of 100 to 4000 Angstroms. If both the first and second dielectric films are deposited, an anneal step, such as a rapid thermal anneal step, is performed after each deposition and/or after both depositions to densify the deposited material. Anneal is preferably performed in the temperature range between 800° to 1150° C. The blanket-grow-and-etch technique is carried forth by blanket growing both dielectrics and thereafter selectively etching both dielectrics preferably using an anisotropic etch. The anisotropic etch performed as a dry or plasma etch operates to produce a demarcation between field and active regions having essentially no encroachment problem generally associated with LOCOS or LOCOS-derived processes. The anisotropic etch will present, if desired, a somewhat perpendicular profile at each or both dielectric films. Thus, both films can be etched using the same lithography mask, or one film can be etched at a different dimension than the other film to produce a stepped composite structure. The stepped structure is used to minimizes any step coverage problems at the field/active region overlayer. The blanket-grow-and-etch technique is thereby well-suited for densely patterned MOS processing.

According to another aspect of the present process, channel-stop implant is carried out after the blanket growth or deposit steps. Thus, light ions such as boron channel-stop dopants are implanted after the first and second dielectric films are thermally grown and/or deposited and annealed. Since the channel-stop dopant is placed after the high temperature cycles associated with thermal growth or anneal, the channel-stop dopants are less likely to segregate or diffuse into the overlying oxide or adjoining lateral areas. By increasing the implant energy of the channel-stop ions, the ions penetrate through the previously formed first and second dielectric films and into the underlying substrate. MeV implant is not necessary in many instances since the first and second dielectric films are relatively thinner than conventional field oxides.

BRIEF DESCRIPTION OF THE DRAWINGS

Other objects and advantages of the invention will become apparent upon reading the following detailed description and upon reference to the accompanying drawings in which.

Figure 1:
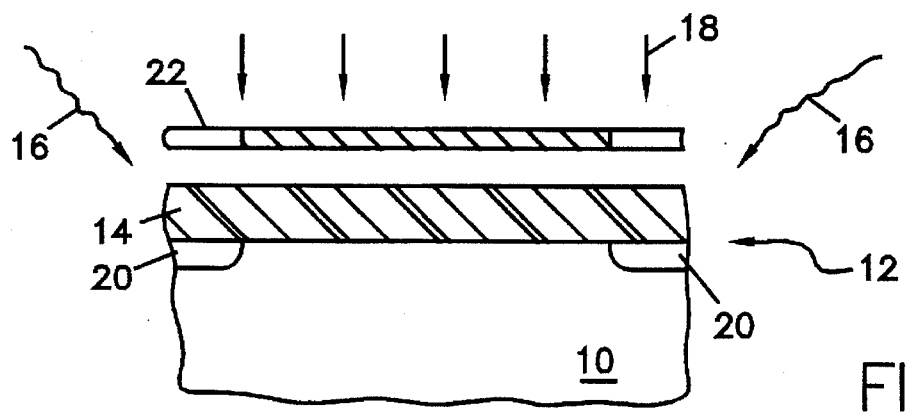
FIG. 1 is a partial cross-sectional view of a semiconductor substrate having a first dielectric film formed upon a surface of the substrate according to a processing step of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a partial cross-sectional view of semiconductor substrate 10 is shown. Substrate 10 includes an upper surface 12 upon which a first dielectric 14 is formed. First dielectric 14 is formed using any technique necessary to produce a low dielectric constant, preferably less than 4.0 and, in some instances, less than 3.7. A low dielectric constant ensures sufficient capacitance between overlying conductive elements and underlying substrate 10. First dielectric 14 must also have a bulk resistivity exceeding, for example, 5 ohms-cm. Still further, first dielectric 14 must have low defect density (i.e., the film material must be sufficiently absent of pinholes and/or contaminants). The above criteria requires first dielectric 14 to be of utmost quality in order to achieve targeted insulative capability in as thin a cross-section as possible. Preferably, first dielectric 14 is formed at a thickness less than 500 Angstroms, and preferably between 100 to 300 Angstroms. For reasons stated below, a thin first dielectric 14 alleviates step coverage problems in active areas removed of first dielectric 14.

Achieving the necessary high quality in as thin a film as possible requires special attention to first dielectric composition and fabrication methodology. First dielectric 14 includes any insulative composition which has the above qualities, including oxide, oxynitride, $N_2O$ oxide, or tantalum pentoxide. First dielectric 14 can thereby be grown on a silicon substrate 10 as silicon dioxide, or it can be deposited from a decomposed (pyrolyzed) source material. If first dielectric 14 is grown as a thermal oxide, first dielectric 14 is grown in the absence of $H_2O$ (i.e., the thermal oxide is grown as "dry oxide"). While growth rate of dry oxide is less than water-enhanced oxide or "wet oxide", dry oxide demonstrates higher quality electrical properties and can more easily meet the above criteria than wet oxide. The dry oxidation rate can be enhanced by increasing the pressure within the oxidation chamber or by reducing the pressure and increasing the oxidation temperature. A controlled dry oxide of 200 Angstroms can be grown, for example, in thirty minutes at 900° C. using a low pressure chamber (i.e., pressures between 0.25 to 2.0 torr).

Instead of first dielectric 14 being a thermally grown oxide, first dielectric 14 can be deposited from a decomposed source of materials, including nitrogen, oxygen or tantalum. Preferably, first dielectric 14 is deposited from a silicon source material such as a silane-based source, dichlorosilane source, $NH_3$ source, etc., at relatively high temperatures in a low pressure chemical vapor deposition (LPCVD) process. The higher temperature range and the silane reaction with for example, nitrous oxide, produces electrical properties close to that of thermal silicon dioxide. Additionally, the high temperature CVD-deposited material contains minimal particulate contamination. Deposition of first dielectric 14 is preferably carried forth without a plasma enhanced reaction and the hydrogen contaminants often associated with that reaction. Moreover, the decomposing material is carried absent tetraethyl orthosilicate (generally referred to as "TEOS"). TEOS includes a hydrogen species which can, in many instances, pyrolyze and combine at upper surface 12 to produce disruptions at the interface. First dielectric 14, if deposited, is deposited from a silane-based source at high temperatures in order for the resulting material to be as dense as possible with high quality insulative structures. Further densification can be carried out, if necessary, at an anneal step performed after deposition. Anneal at temperatures between 800° to 1150° C. produce substantial densification from, for example, 2.0–2.8 g/cm$^3$ to 2.8 g/cm$^3$ or above. Densification is carried out by the introduction of thermal energy, shown by reference numeral 16. Application of thermal energy 16 is either performed in a tube or in a rapid thermal annealer (RTA). If RTA is used, the anneal cycle time is minimized.

Either growth or deposition of first dielectric 14 can be used to produce the desired electrical properties. If deposition is used, it is necessary to use a high temperature deposition preferably followed by an anneal cycle. It is important to note, however, that a thermally grown dielectric can also be annealed to enhance the dielectric properties, if desired. The high temperature thermal growth, deposition and anneal is performed at an initial stage of circuit development. It is contemplated that the high temperature dielectric formation steps occur before channel-stop dopants are implanted.

FIG. 1 further illustrates in a step subsequent to first dielectric film 14 formation and the high temperature cycles used during formation. A channel-stop implant of p- or n-type impurities 18 is shown placed through first dielectric film 14 and into field regions 20. Channel-stop implant is performed using normal lithography techniques, through openings created by a mask-derived resist layer. A suitable mask used in forming the patterned resist is shown as reference numeral 22.

Figure 2:
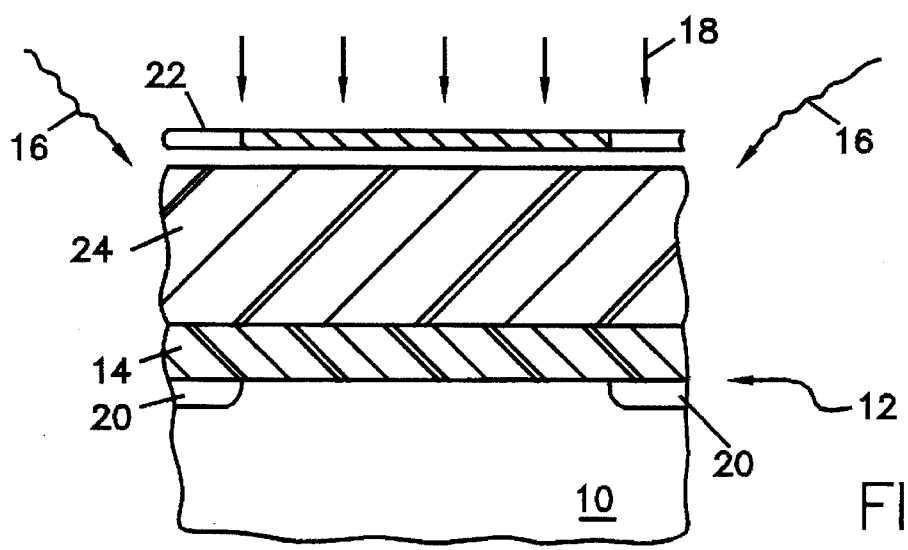
FIG. 2 is a partial cross-sectional view of the semiconductor substrate having a second dielectric film formed over the first dielectric according to a subsequent processing step of the present invention.

The high temperature processing cycles used in forming first dielectric film 14 enhance dielectric properties, but not at the detriment of the subsequently placed channel-stop implant. According to one embodiment, channel-stop implant 18 can be delayed until after a second field dielectric 24 is formed, as shown in FIG. 2. If delayed, second dielectric 24 processing can occur at high temperatures similar to those used in forming first dielectric 14 without deleteriously affecting the subsequent placed channel-stop implant. Conversely, if the channel-stop implant is not delayed and is performed before the second dielectric formation, then the second dielectric must be processed at reduced temperatures. It is preferred that the channel-stop implant be delayed until after the first and second dielectrics are formed. Using a suitable energy, channel-stop implant can occur through both dielectric films.

Turning now to FIG. 2, second dielectric 24, similar to first dielectric 14, is either thermally grown or chemically deposited. If second dielectric 24 is not restricted to a low temperature processing range, second dielectric 24 is preferably processed with similar parameters to that used in forming first dielectric 14. If, however, second dielectric 24 is produced at lower temperatures, such as would be the case if channel-stop implant 18 pre-exists in field regions 20, then a medium temperature range between, for example, 350° C. to 800° C. may be used to deposit the material or grow the material. Thermal growth is preferably from a dry oxidation process or, in the alternative, from a thermal nitridation of the pre-existing silicon dioxide of first dielectric 14. Thermally grown silicon nitride are less susceptible to hot electron effects (HCE), are highly dense (above 3.0 grams/ $cm^3$) and appear to have good dielectric breakdown properties and high bulk resistivity.

Second dielectric 24 must have high quality dielectric properties, similar to first dielectric 14 as specified above. Depending upon the processing parameters and chemical composition used, second dielectric 24 is either chemically deposited or thermally grown followed by, if desired, an anneal step by which second dielectric 24 is subjected to a temperature cycle in the range of 800° C. to 1150° C. Thermally grown or deposited second dielectric 24 followed by an appropriate anneal cycle produces electrical characteristics which approach the quality level described in relation to first dielectric 14. Second dielectric 24 can be of somewhat lesser electrical quality if a higher throughput (growth rate or deposition) is desired. In any instance, second dielectric 24 is formed at a thickness less than 4000 Angstroms, and preferably between 1000 to 2000 Angstroms. The overall thickness of first and second dielectrics 14 and 24 is thereby less than 4000 Angstroms, and preferably less than 3000 Angstroms (e.g., between 1000 to 3000 Angstroms).

Figure 3:
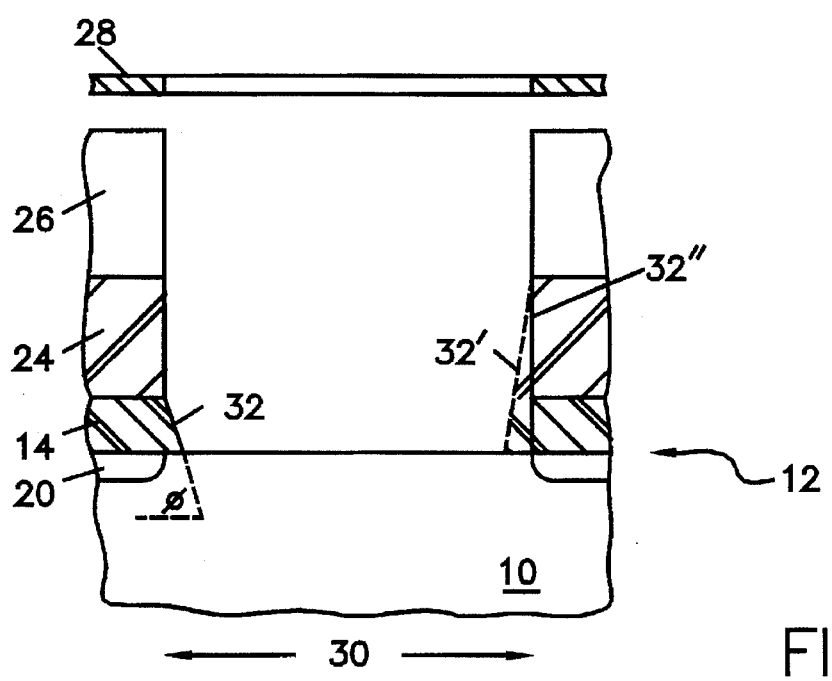
FIG. 3 is a partial cross-sectional view of the semiconductor substrate showing the first and second dielectric films selectively removed in active regions according to a subsequent processing step of the present invention.

Turning now to FIG. 3, a subsequent processing step is shown by which select portions of first and second dielectrics 14 and 24 are removed. Removal is carried out using lithography techniques wherein polymerized and non-polymerized photoresist 26 is fashioned according to a mask 28. Mask 28 creates polymerized resist over field regions 20. The non-polymerized resist is removed thereby allowing an etching avenue to exposed portions of first and second dielectrics 14 and 24. The exposed portions of dielectrics 14 and 24 are removed to present an exposed surface 12 under which an active region 30 will thereafter be defined.

Active region 30 is defined using mask 28, and mask 28 is of reverse polarity to mask 22. Thus, mask 28, and the steps necessary to produce mask 28, are simplified given the pre-existing mask 22. Active region 30 includes the region upon which isolated devices, transistors, etc., are formed. A slight encroachment 32 into active region 30 from field region 20 is shown. Encroachment 32 is shown as a result of the etchant used to remove first and second dielectrics 14 and 24. First dielectric 14 can be more dense than second dielectric 24, and is preferably more dense in many applications. A dense first dielectric 14 can be more difficult to remove through the etching process, a result being a sloped sidewall 32 at the first dielectric 14. Alternatively, both first and second dielectrics 14 and 24 can be dense providing a sloped, continuous sidewall shown by reference numeral 32'. Still further, etching can be carried out using a highly anisotropic plasma etchant material suitable to remove the specific chemical composition defined by first and/or second dielectrics 14 and 26, respectively, a result being an almost perpendicular sidewall, shown by reference numeral 32". Most plasma etchant is substantially anisotropic and, produces a relatively perpendicular profile, wherein the profile angle, ϕ, exceeds in most instances 80°, and in some instances approaches 90°. A substantially perpendicular profile ensures little or no encroachment into the active region.

Minimal encroachment provides a higher density patterned product and is certainly more dense than the conventional LOCOS processes. Generally speaking, LOCOS processes require rework at the active region edges to prevent substantial encroachment from the field into the active regions. The rework is time consuming and difficult at best to carry out. At present, non-LOCOS process hereof ensures substantially no encroachment and is thereby well-suited for circuits having sub-micron critical dimensions. Even at profile angles approximating 80°, encroachment is minimal due to the minimal thickness of first dielectric 14. In many instances it is predicted that worst case encroachment would be less than 0.1 μm per side. A designed demarcation position is thereby more easily maintained between the mask and the wafer. This ensures the designer that process fluctuations will have little or no effect on the relative location of the field and active regions and that lateral oxide growth, or bird's beak, will not exist.

Figure 4:
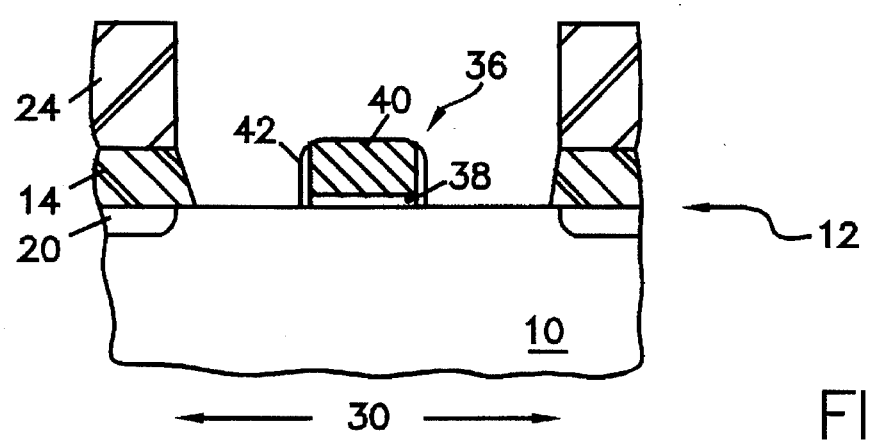
FIG. 4 is a partial cross-sectional view of the semiconductor substrate having a gate conductor arrangement formed in the active regions according to a subsequent processing step.
Figure 5:
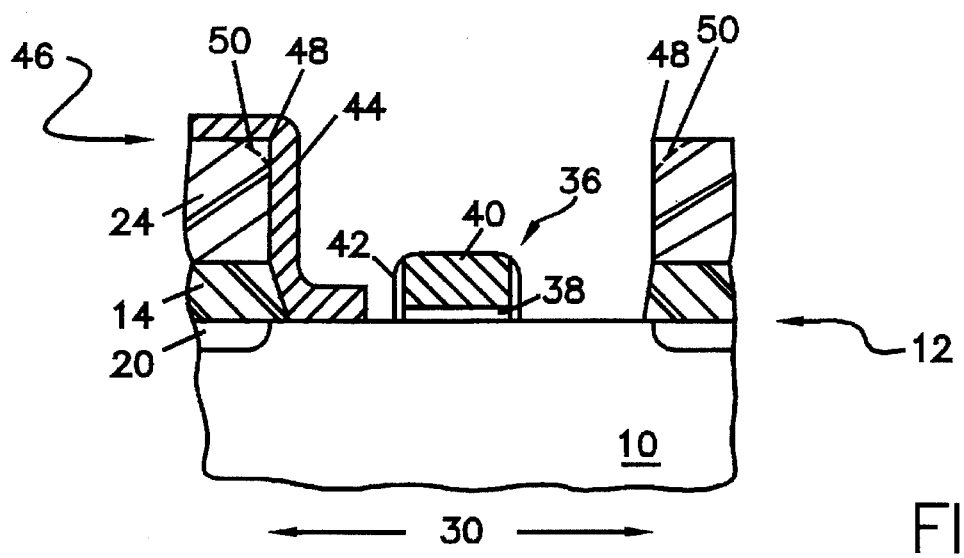
FIG. 5 is a partial cross-sectional view of the semiconductor substrate having a conductive trace element formed across the field and active regions according to a subsequent processing step.

Turning now to FIGS. 4 and 5, FIG. 4 illustrates a processing step subsequent to that shown in FIG. 3. Namely, photoresist 26 is completely removed and gate components 36 are formed within active region 30. Gate components comprise a patterned gate conductor 40 overlying a patterned gate oxide 38. Sidewall spacers 42 can be used to provide lightly doped drains (LDD), if desired. Using the self-aligned process, source and drain dopants are implanted into active region 30. Using a contact mask, openings are formed into the source and drain areas through which a conductive layer 44 is deposited. The conductive layer is thereafter patterned to form the first of possibly many layers of laterally spaced conductive trace elements separated from each other by an interlayer dielectric.

Conductive layer 44 extends from an upper surface 46 of second dielectric 24 to upper surface 12 of semiconductor substrate 10. It is necessary that the sputter deposited conductive layer be of substantially uniform thickness from surface 46 to surface 12. To ensure adequate thickness at the critical upper corner 48 of second dielectric 24, it is imperative that the overall thickness of first and second dielectrics be minimal. First and second dielectrics 14 and 24 are defined herein as having a combined thickness less than 4000 Angstroms and, in many instances, less than 2500 Angstroms. To further ensure proper step coverage at corners 48, a reflow technique may be used to shape corner 48 a configuration shown in dashed line and referenced as numeral 50. Doping second dielectric 24 during the deposition process helps to decrease the reflow temperature. However, in many instances, reflow is naturally achieved during the high temperature thermal growth cycle or a deposition cycle followed by an anneal. The higher temperature process used to achieve high quality dielectric naturally results in a rounding 50 at corners 48 to enhance step coverage. Thus, the combination of a thinner dielectric structure and the higher temperature processing steps used to produce said structure thereby produces an optimal field oxidation process in areas between active regions 30 and directly above field regions 20. As an alternative, or in addition to reflow, a wet etchant can be used to selectively etch the oxide as opposed to silicon. A predominant amount of etching is purposefully directed at corners 48 to round the corners to the shape shown by reference numeral 50. The etchant can be used as a dip after the field dielectric structure is formed but before gate oxide growth.

It will be appreciated to those skilled in the art having the benefit of this disclosure that this invention is believed to be capable of applications for numerous types of integrated circuits embodied within a semiconductor substrate. Furthermore, it is also to be understood that the form of the invention shown and described is to be taken as exemplary, presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for isolating active regions within a semiconductor substrate, comprising:

forming a first dielectric film directly upon an entire surface of a semiconductor substrate;

forming a second dielectric film directly upon the entire said first dielectric film, wherein said first dielectric film is interposed between said semiconductor substrate and said second dielectric, and wherein the thickness of said first and second dielectric films is less than 4000 angstroms; and removing said first and second dielectric films over entire active regions within said semiconductor substrate.

2. The method as recited in claim 1, wherein said first dielectric forming step comprises thermally growing said first dielectric film in the absence of $H_2O$.

3. The method as recited in claim 1, wherein said first dielectric forming step comprises thermally growing said first dielectric film to a thickness between 100 and 500 angstroms and at a temperature and pressure sufficient to densify the first dielectric to a dielectric constant less than 4.0.

4. The method as recited in claim 1, wherein said first dielectric forming step comprises depositing said first dielectric film from a chemical vapor deposition chamber and thereafter annealing said first dielectric film at a temperature between 800° C. and 1150° C.

5. The method as recited in claim 4, wherein said annealing step is performed in a gas ambient selected from the group consisting of Ar, $N_2$, $N_2O$ and NO.

6. The method as recited in claim 1, wherein said second dielectric forming step comprises thermally growing said second dielectric film in the presence of a nitrogen gas.

7. The method as recited in claim 1, wherein said second dielectric forming step comprises depositing said second dielectric film from a chemical vapor deposition chamber to a thickness between 100 and 1400 angstroms, and thereafter annealing said second dielectric film at a temperature between 800° C. and 1150° C. to produce a dielectric constant less than 3.7.

8. The method as recited in claim 7, wherein said annealing step is performed in a gas ambient selected from the group consisting of Ar, $N_2$, $N_2O$ and NO.

9. The method as recited in claim 1, further comprising the step of implanting source and drain junctions within said active regions and thereafter patterning a metal extending over a portion of said second dielectric film and onto at least one of said junctions.

10. The method as recited in claim 1, wherein the combined thickness of said first and second dielectric films is less than 600 angstroms.

11. The method as recited in claim 1, wherein the combined thickness of said first and second dielectric films is less than 4000 angstroms.

12. The method as recited in claim 1, further comprising the step of implanting an ion species through the combined thickness of said first and second dielectric films and into said semiconductor substrate to form a channel stop region therein.

13. A method for producing a dielectric over a semiconductor substrate between active regions within said semiconductor substrate, comprising:

forming a first and a second dielectric film across an entire surface of a semiconductor substrate;

densifying said first and said second dielectric films to form said first and second dielectric films having a combined density greater than 2.4 $g/cm^3$, a combined dielectric greater than 3.0, and a combined resistivity greater than 5.0 ohms cm;

selectively removing said first and second dielectric films to expose the semiconductor substrate in said active regions within said semiconductor substrate; and implanting source/drain dopants into the exposed said active regions.

14. The method as recited in claim 13, wherein said forming step comprises thermally growing said first dielectric film and chemical vapor depositing said second dielectric film.

15. The method as recited in claim 13, wherein said densifying step comprises annealing said first and second dielectric films in a temperature ambient between 800° C. and 1150° C.

16. The method as recited in claim 13, wherein said annealing step is performed in a gas ambient selected from the group consisting of Ar, $N_2$, $N_2O$ and NO.

17. The method as recited in claim 13, wherein the combined thickness of said first and second dielectric film is less than 600 angstroms.

18. The method as recited in claim 13, wherein the combined thickness of said first and second dielectric film is less than 4000 angstroms.

19. A method for forming a channel stop between a pair of active regions formed upon an upper surface of a semiconductor substrate, comprising:

providing a semiconductor substrate having a pair of active regions formed upon an upper surface of said semiconductor substrate;

growing a thermal oxide at a temperature exceeding 900° C in an ambient void of $H_2O$ across an entire surface of a semiconductor substrate;

implanting a channel stop dopant through said thermal oxide, into said semiconductor substrate and between said pair of active regions;

chemical vapor depositing an oxide from an undoped, silane-based source at a temperature less than 600° C. across an entire surface of said thermal oxide; and selectively removing said thermal oxide and said deposited oxide in areas directly above said active regions.

20. The method as recited in claim 19, wherein said thermal oxide thickness is less than 500 angstroms.

21. The method as recited in claim 19, wherein said deposited oxide thickness is less than 4000 angstroms.

22. A method for forming a channel stop between a pair of active regions formed upon an upper surface of a semiconductor substrate, comprising:

providing a semiconductor substrate having a pair of active regions formed upon an upper surface of said semiconductor substrate;

growing a thermal oxide at a temperature exceeding 900° C in an ambient void of $H_2O$ across an entire surface of a semiconductor substrate;

chemical vapor depositing an oxide from an undoped silane-based source at a temperature exceeding 900° C. across an entire surface of said thermal oxide;

implanting a channel stop dopant through both said thermal oxide and said deposited oxide, into said semiconductor substrate and between said pair of active regions; and selectively removing said thermal oxide and said deposited oxide in areas directly above said active regions.

* * * * *